United States Patent [19]

Mader

[11] 4,278,986
[45] Jul. 14, 1981

[54] SEMICONDUCTOR DIODE

[76] Inventor: Hermann Mader, Carl-Duisberg-Str. 42, 8025 Unterhaching, Fed. Rep. of Germany

[21] Appl. No.: 103

[22] Filed: Jan. 2, 1979

[30] Foreign Application Priority Data

Jan. 10, 1978 [DE] Fed. Rep. of Germany ....... 2800820

[51] Int. Cl.³ ............................................ H01L 29/00
[52] U.S. Cl. ........................................ 357/33; 357/13; 357/30; 357/56
[58] Field of Search ......................... 357/13, 30, 33, 56

[56] References Cited

U.S. PATENT DOCUMENTS 4,149,174  4/1979  Shannon .................................. 357/13
4,167,748  9/1979  D'Angelo et al. ...................... 357/13

Primary Examiner—Edward J. Wojciechowicz
Attorney, Agent, or Firm—Hill, Van Santen, Steadman, Chiara & Simpson

[57] ABSTRACT

A semiconductor diode comprises an NPN or a PNP-three-layer structure of alternate conductivity type formed of three bordering semiconductor layers and having ohmic contacts. The diode is characterized in that in order to reduce the energy barrier, the central layer in the three-layer structure is selected in its thickness to be so thin that already without external electrode voltage applied to the ohmic contacts, with a given doping of the central layer, the entire central layer is depleted of free charge carriers.

4 Claims, 13 Drawing Figures

SEMICONDUCTOR DIODE

BACKGROUND OF THE INVENTION

The invention relates to a semiconductor diode such as is disclosed in the preamble of patent claim 1.

It is known that in the case of pn-diodes as well as in the case of Schottky-diodes, the threshold voltage essentially is determined by the band width of the utilized semiconductor. For small threshold voltages, semiconductors with a minimal band width are generally required. The fabrication of narrow band semiconductor-diodes, however, is at the present time still very difficult and costly.

Furthermore, it is known that, in the case of pn-diodes, minority carrier effects dominate, and in the case of Schottky-diodes, majority carrier effects dominate. Accordingly, Schottky-diodes have substantially higher cut-off frequencies than pn-diodes.

From "Solid State Electronics" (1976), Vol. 19, Pages 625-631, a so-called barite-pn-diode is known which is utilized as a generator for producing very high frequencies; for example, 10 GHz. In this diode, transit time effects are utilized which essentially occur in the central intermediate layer of the diode. This intermediate layer, as is shown in FIG. 1 of this publication, manifests a construction and a doping in which, without an applied external voltage, aside from the most extreme marginal regions, there is virtually no depletion of free charge carriers. The high field strengths in this intermediate layer, necessary in order to utilize the transit time effects, require that this intermediate layer manifest a considerable minimum doping. The thickness of this intermediate layer, conditioned in turn by the specified frequency to be generated, leads to the result that only the previously mentioned marginal regions are depleted of free charge carriers.

Likewise serving the production of high frequency is an impact avalanche transit-time diode known from the German Offenlegungschrift No. 2,224,159 which is constructed of two p- and n-semiconductor layers superimposed on a metal electrode. The central layer, in the case of this hetero-construction, is to manifest a doping in comparison with the above-disposed semiconductor layer which is approximately greater by two orders of magnitude, so that, when operating voltage is lacking, even in the case of such a diode, virtually only marginal regions of this central layer manifest a depletion of free charge carriers, such as is, moreover, known of every pn-junction.

OBJECT AND BRIEF SUMMARY OF THE INVENTION

It is an object of the invention to produce such a semiconductor-diode which has a level—(technologically) fixedly specifiable, respectively—of its energy barrier which lies below the value specified by the conventional pn-junction. In particular, it is an object of the present invention to produce a photo-electric element which is improved in its sensitivity—namely, due to the reduced level of the energy barrier.

This object is achieved with a semiconductor-diode in accordance with the preamble of patent claim 1 as is disclosed in the characterizing clause of patent claim 1. Further embodiments and additional advantageous applications—based on the invention—of the invention are apparent from the subclaims.

The idea underlying the invention is to construct a three-layer structure which consists either of an npn-layer sequence or a pnp-layer sequence, wherein, however, in contrast with the injection transistor, the central layer is so thin that, in the case of a selectively specified doping level of this central layer, the entire region of this central area is depleted of free charge carriers already without an external applied electric voltage.

The following methods known per se are suitable for the fabrication of such diodes:

(a) Ion implantation
(b) Molecular beam epitaxy.

The advantages to be achieved with the invention consist particularly in that the threshold voltage of the diode can be continuously adjusted, via technological parameters such as doping density (or layer thickness), in the range between the thermal voltage $U_T$ and the diffusion voltage $U_D$. At room temperature $U_T \approx 25$ mV and $U_D \approx 1$ V. It is therefore e.g. possible to realize silicon diodes with very small threshold voltages.

An additional advantage consists in that, on account of the dominating majority carrier current, the diode can be utilized up to very high frequencies.

BRIEF DESCRIPTION OF THE DRAWINGS

The invention shall now be explained in greater detail and described on the basis of the Figures represented in the drawing.

DESCRIPTION OF THE PREFERRED EMBODIMENTS

Figure 1:
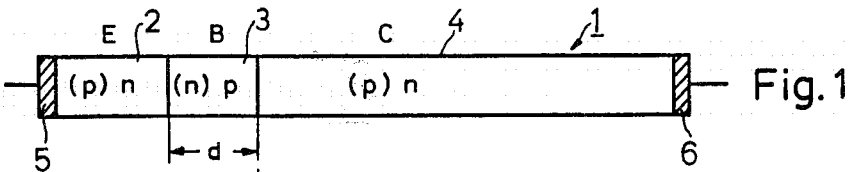
FIG. 1 schematically illustrates the construction of the semiconductor diode according to the invention.

In FIg. 1, the construction of the semiconductor diode 1 is schematically illustrated. The diode 1 consists, like an injection transistor which is known per se, of an npn- or a pnp-3-layer structure with the three bordering layers 2, 3 and 4.

The electrodes are referenced with 5 and 6 and form ohmic contacts. In contrast with the known injection transistor, in the case of the invention, the base zone (B); i.e., layer 3, is, however, so short, or so thin, respectively, that its entire area is already depleted of free charge carriers without an external applied voltage. The resulting quantitative dimension of the thickness d is dependent upon the selected doping density.

Figure 2:
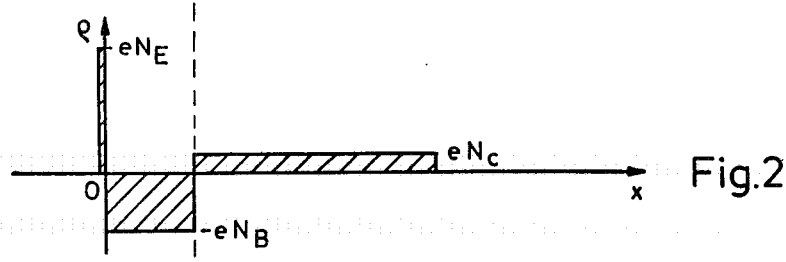
FIG. 2 illustrates the curve of the space-charge density in the diode in the case of thermal equilibrium.

FIG. 2 illustrates the local progression of the space charge density in diode 1 in the case of thermal equilibrium; i.e. without external applied voltage. The base (B), or layer 3, respectively, contains, in contrast with the known injection transistor, no neutral zone in the case of the invention. The space charge densities in the individual zones are determined by the corresponding doping densities. In FIG. 2, $N_E$, $N_B$ and $N_C$ are the doping densities in the emitter (E), base (B) and collector (C), and $e = 1.6 \cdot 10^{-19}$ As is the elementary charge.

Figure 3:
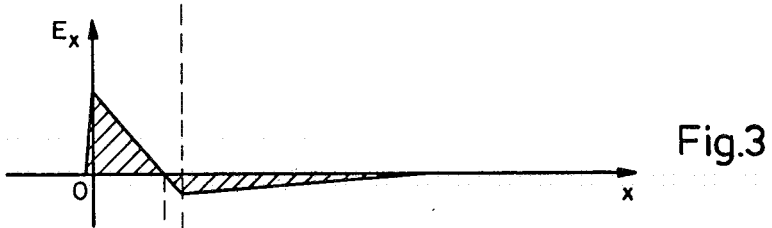
FIG. 3 illustrates the curve of the electric field strength in the case of thermal equilibrium.

In FIG. 3, the local progression of the electric field strength $E_x$ in the diode is again illustrated for thermal equilibrium, which is apparent from the space charge density $eN(x)$ through the following integration:

$$E_x = \int_{x_1}^{x_2} \frac{eN(x)}{\epsilon} dx \quad (1)$$

In equation (1), $\epsilon$ is the dielectric constant of the semiconductor employed.

Figure 4:
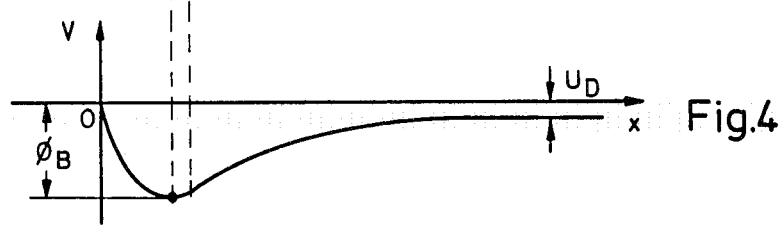
FIG. 4 illustrates the curve of the electric potential in the case of thermal equilibrium.

FIG. 4 represents the spatial progression of the electric potential $V(x)$ in the diode 1 in the case of thermal equilibrium. The height of the potential hill $\phi_B$ is dependent upon the thickness d and the doping density $N_B$ of the base as follows:

$$\phi_B \approx \frac{eN_B}{2\epsilon} \cdot d^2 \quad (2)$$

Equation (2) applies only four $N_E >> N_B >> N_C$.

From equation (2), it is apparent that the height $\phi_B$ of the potential hill can be technologically adjusted by d and $N_B$.

For the diffusion potential $U_D$ the following applies:

$$U_D = U_T \ln(N_E/N_C) \quad (3)$$

The diffusion voltage $U_D$ is determined by the thermal voltage $U_T$ ($U_T \approx 25$ mV at room temperature) and by the ratio of emitter-to base-doping density $N_E/N_C$.

Figure 5:
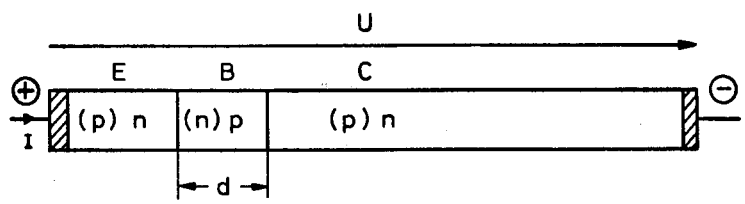
FIG. 5 illustrates the curve of the electric potential in the case of applied positive voltage.

FIG. 5 illustrates the spatial progression of the electric potential in the diode given an applied positive voltage. The space charge zones are here so displaced that the right potential barrier $\phi_R$ becomes smaller than the left, $\phi_L$. Thus, more majority carriers travel from the collector (C) to the emitter (E) than conversely. The resulting electric current I can be calculated from:

$$I \approx I_s \cdot \exp(-\phi_R/U_T) \quad (4)$$

In equation (4) $I_s$ is the saturation current. The current I increases with potential barriers $\phi_R$ which are becoming smaller.

Figure 6:
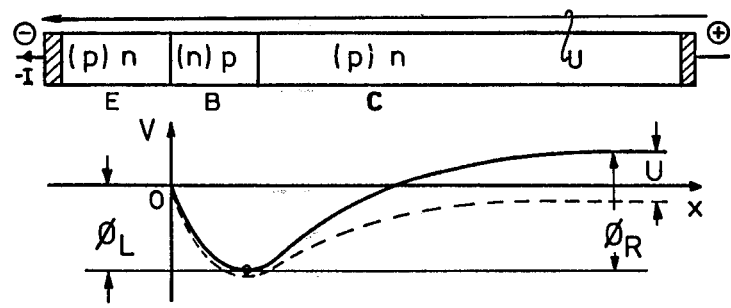
FIG. 6 illustrates the curve of the electric potential in the case of applied negative voltage.

In FIG. 6 the spatial progression of the electric potential in the diode in the case of applied negative voltage is represented. In this instance, the displacement of the space charge zones results in a small left potential barrier $\phi_L$. For the electric current I, correspondingly, the following is obtained:

$$I \approx -I_s \exp(-\phi_L/U_T) \quad (5)$$

Figure 7:
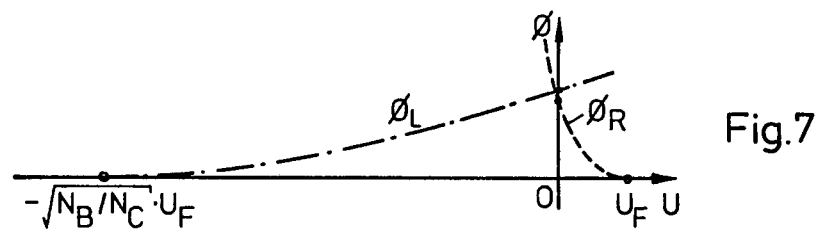
FIG. 7 illustrates the potential barriers $\phi_R$ and $\phi_L$ in dependence upon the applied voltage.

FIG. 7 illustrates the voltage dependency of the potential barriers $\phi_R$ and $\phi_L$. In the case of $U=0$, $\phi_R$ and $\phi_L$ differ only by the small diffusion voltage $U_D$ given by equation (3). With increasing positive voltage, $\phi_R$ drops. In the case of the flat band voltage $U_F$, the right potential barrier $\phi_R$ is completely broken down. For $N_E >> N_B >> N_C$, the following applies:

$$U_F = \frac{eN_B}{\epsilon} d^2 = 2\phi_B \quad (6)$$

The flat band voltage $U_F$ is equal to double the potential hill height $\phi_B$ in the case of thermal equilibrium (see FIG. 4). With increasing negative voltage, $\phi_L$ becomes smaller and, with the voltage $-\sqrt{N_B/N_C} \cdot U_F$, reaches the value zero. The ratio of base-to collector-doping density $N_B/N_C$ thus determines the asymmetry of the voltage dependency of $\phi_R$ and $\phi_L$ and according to equations (4) and (5) also the asymmetry of the current-voltage characteristic.

Figure 8:
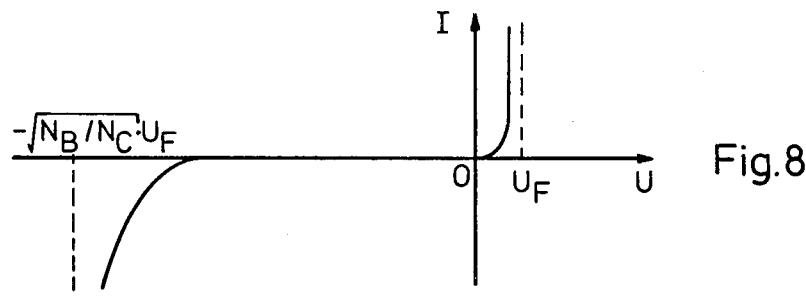
FIG. 8 illustrates the principal curve of the current-voltage characteristic.

In FIG. 8, the basic progression of the current-voltage-characteristic is illustrated. Whereas, in the case of positive voltages, the current I in proximity of the flat band voltage $U_F$ increases greatly, this occurs in the cut-off range of the diode only with voltages in the area of $\sqrt{N_B/N_C} \cdot U_F$. The asymmetry of the characteristic thus is strongly dependent upon the ratio of the doping densities in the base and collector. The current-voltage characteristic, with $N_E N_B N_C$, can be expressed by:

$$I \approx \begin{cases} I_s \cdot \exp\left[-\frac{U_F}{2U_T}\left(1 - \frac{U}{U_F}\right)^2\right]\left[1 - \exp\left(-\frac{U}{U_T}\right)\right] & \text{for } U \geq 0 \\ -I_s \cdot \exp\left[-\frac{U_F}{2U_T}\left(1 + \frac{U}{\sqrt{N_B/N_C} \cdot U_F}\right)^2\right]\left[1 - \exp\left(-\frac{U}{U_T}\right)\right] & \text{for } U < 0 \end{cases} \quad (7)$$

$I_s$: Saturation current
$U_F$: Flat band voltage, according to equation (6) technologically adjustable with $N_B$ and d
$U_T$: Thermal voltage ($U_T \approx 25$ mV at room temperature)
$N_{B,C}$: Doping densities of base, or collector, respectively.

Figure 9:
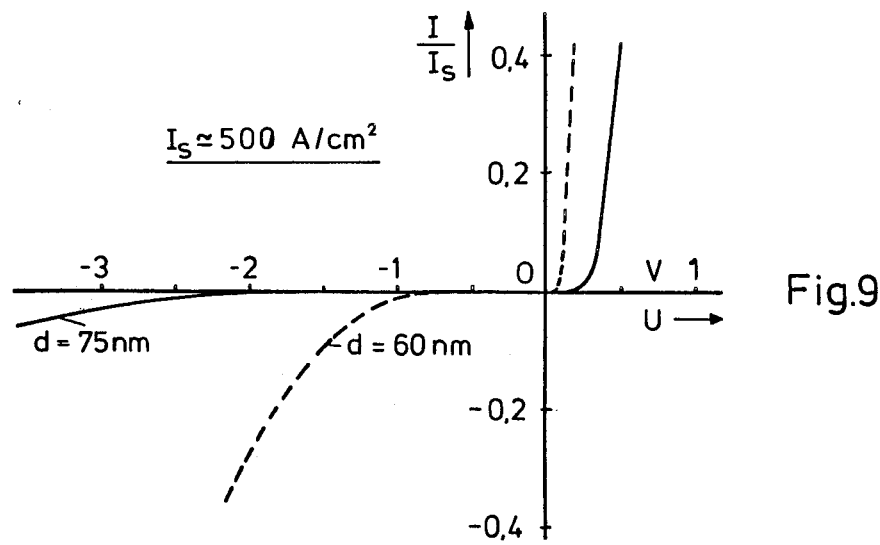
FIG. 9 illustrates current-voltage characteristics for two diodes having different base thicknesses.

FIG. 9 illustrates current-voltage characteristics for two silicon diodes having various base density. In the calculation, the following data were assumed:

| | |
|---|---|
| Emitter doping | $N_E = 10^{19}$ cm$^{-3}$, |
| Base doping | $N_B = 10^{17}$ cm$^{-3}$, |
| Collector doping | $N_C = 10^{15}$ cm$^{-3}$. |
| Base thickness | $d_1 = 60$ nm for first diode (---) |
| | $d_2 = 75$ nm for second diode (—) |

From FIG. 9 it is apparent that, in the case of both diodes, the threshold voltage is smaller than 0.5 V. The blocking behavior is governed by the ratio of $N_B/N_C$ (see FIG. 8). In the case of a greater difference of the doping densities $N_B$ and $N_C$, the blocking behavior of the diodes becomes more pronounced.

Figure 10:
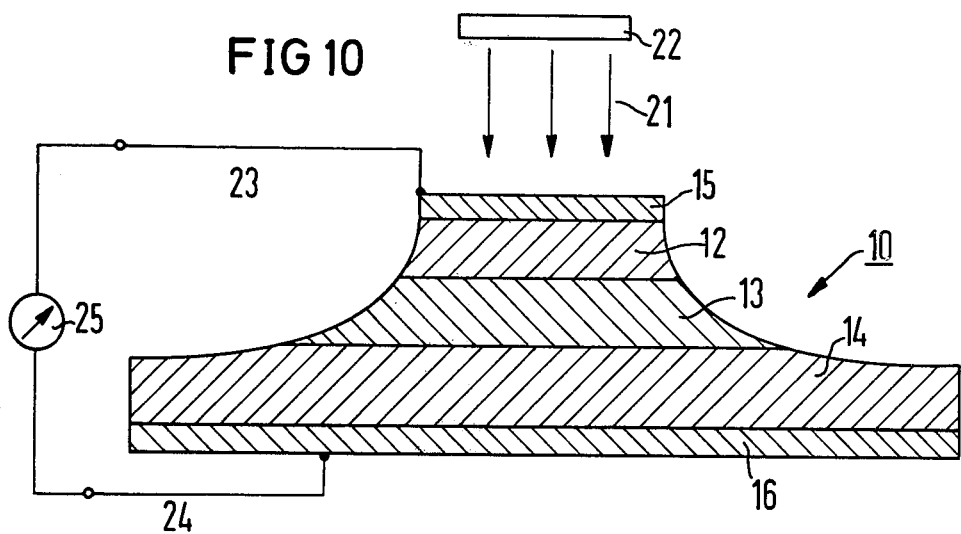
FIG. 10 illustrates another embodiment of an inventive diode having a construction in the type of a mesa structure, whereby this diode is also illustrated in its utilization as a photo-voltaic detector.

FIG. 10 illustrates another specific embodiment of an inventive diode 10; namely, an embodiment of such a type wherein the two pn-junction surfaces between the layers 12 and 13, or 13 and 14, are of different sizes. These layers 12, 13 and 14, physically correspond to the layers 2, and 3, and 4, already described above in detail. The ohmic contacts are referenced by 15 and 16.

From FIG. 10, in addition, an example is apparent for the utilization of an inventive diode as a photosensitive component; for example, as a photo-voltaic cell. Corresponding to FIG. 10, this application is described for the diode 10; however, it also analogously applies to a diode 1 according to FIG. 1. 21 indicates an electromagnetic, particularly light radiation, ultraviolet radiation, or also infrared radiation which originates e.g. from a light source 22. This radiation 21 penetrates the electrode 15, transmissively constructed for this purpose, into the layers 12, 13, and 14, of the diode 10. Instead of a transmissivity of diode 15, the electrode 15 can also be provided with an annular or perforated construction. The irradiated radiation 21 generates in the diode 10, constructed of the layers 12, 13 and 14, a photo-voltaic electric voltage, or a photo-current, respectively, which can be tapped between the electric terminals 23 and 24, connected to the electrodes 15, or 16, respectively, and which can be detected e.g. by the measuring instrument 25.

Corresponding to the quantum energy of the radiation 21 to be detected, respectively, for example, for infrared radiation, for example, a particularly low level of the energy barrier is desired as can be realized with the invention in contrast to the state of the art. Specifically for ultraviolet radiation 21, it is advisable to construct layer 12, or layer 2, to be thin—e.g. thinner than 1 μm. What is achieved thereby is that the charge carriers already produced in the case of ultraviolet radiation essentially in the uppermost layer components of layer 12, can optimally contribute to the generated photoelectric current, or to the generated photoelectric voltage, respectively.

Other applications of the invention, taking advantage of the inventively reducible energy barrier, are the utilization of an inventive diode as clamping diode in connection with bipolar transistors; namely, for the purpose of increasing their circuit speed.

Figure 11:
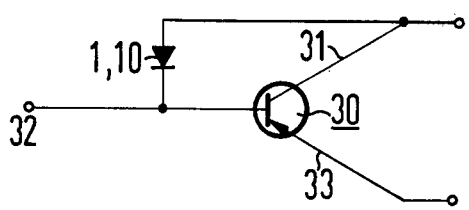
FIGS. 11 through 13 illustrate basic circuit diagrams for utilizations of an inventive diode as a clamp-diode (FIG. 11), as a frequency changer (FIG. 12) and as a mixer (FIG. 13).

FIG. 11 illustrates a basic circuit diagram of such an application with a bipolar transistor 30 between whose collector output 31 and base input 32 a diode 1, or 10, respectively, as according to the invention, is inserted. 33 denotes the emitter of the transistor 30.

Figure 12:
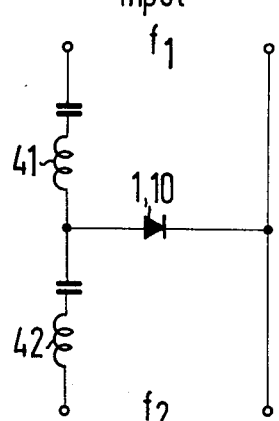

FIG. 12 illustrates a basic circuit diagram of the utilization of an inventive diode 1, 10, as frequency changer-diode, for the purpose of changing the frequency $f_1$ of an ingoing signal into any type of frequency $f_2$ which is harmonic with the frequency $f_1$, as the outgoing signal. 41 and 42 denote oscillatory circuits in this basic circuit.

Figure 13:
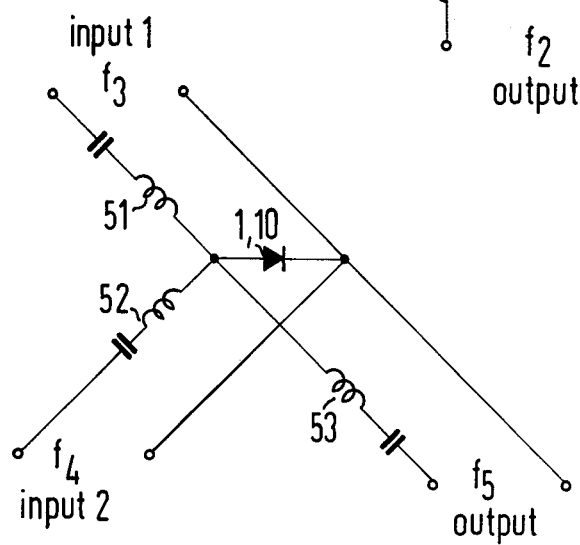

FIG. 13 illustrates the application of an inventive diode 1, 10, in a mixer circuit illustrated in principle with the input frequencies $f_3$ and $f_4$, from which the output signal of the frequency $f_5$ is produced. 51, 52, 53, denote oscillating circuits serving the purpose of tuning.

Regarding the technological construction of an inventive diode, it must be additionally noted that it is possible to use, for the individual layers 2, 3, 4 or 12, 13, 14, respectively, of the layer structure, one and the same semiconductor material; for example, an element semiconductor such as silicon, or also a compound semiconductor such as gallium arsenide.

However, it is also possible to achieve advantages if all layers, or only partially adjacent layers, respectively, consist of mutually different semiconductor material in each instance; such as e.g. layer 2 or 12, or layer 4 or 14, respectively, of gallium arsenide, and the adjacent layer 3 or 13 of gallium-aluminum arsenide.

Particularly in connection with luminescence, it is advantageous to utilize a semiconductor material with a direct band junction; for example, gallium arsenide, for one layer, respectively, or also for all layers 2 through 4, or 12 through 14, respectively, of an inventive diode.

For one or both electrodes, respectively, of an inventive diode, it is advantageous in terms of achieving improved ohmic contacts and/or for the avoidance of an alloying of the material of the contact, to utilize in the case of the semiconductor layers which are particularly thin in the invention, a semiconductor-metal-compound material such as e.g. aluminum-silicon-material. Such a compound material is manufactured e.g. by means of a common, simultaneous vapor deposition of silicon and aluminum.

Explanation of the Symbols Used d: thickness of the base zone
e: elementary charge
ε: dielectric constant of the utilized semiconductor
$E_x$: electric field strength
I: electric current
$I_S$: saturation current
$N_E$: doping density of the emitter
$N_B$: doping density of the base
$N_C$: doping density of the collector
U: applied voltage
$U_D$: diffusion voltage
$U_F$: flat band voltage
V: electric potential
φ: potential barrier
$φ_B$: potential barrier in the case of thermal equilibrium
$φ_{L,R}$: potential barriers in the case of applied voltage
ρ: space charge density

I claim:

1. A three layer pnp or npn semiconductor diode formed with a middle base region of opposite conductivity type located between an emitter region and a collector region with a first ohmic contact affixed to an exterior surface of the emitter region and a second ohmic contact affixed to an exterior surface of the collector region, characterized in that the base region is selected to have a width in combination with a doping density of the emitter which is on the order of two orders of magnitude greater than a doping density of the base which in turn is on the order of two orders of magnitude greater than a doping density of the collector region such that the base region is fully depleted of free charge carriers without an applied external voltage.

2. The diode according to claim 1 wherein said base width is selected from a range corresponding substantially to 60-75 nm when said doping of said emitter region corresponds substantially to $10^{19}$ cm$^{-3}$, said doping of said base corresponds substantially to $10^{17}$ cm$^{-3}$ and said doping of said collector corresponds substantially to $10^{15}$ cm$^{-3}$.

3. A three layer pnp or npn semiconductor diode, adapted to be used as a photodetector, formed with a middle base region of opposite conductivity type located between an emitter region and a collector region, a first ohmic contact affixed to an exterior surface of the emitter region and a second ohmic contact affixed to an exterior surface of the collector region characterized in that said emitter ohmic contact is adapted to permit incident electromagnetic waves to pass therethrough to the adjacent emitter region, a common surface between the base region and the collector region with an area that is greater than a common surface between the base region and the emitter region, the base region is selected to have a width in combination with a selected doping of the emitter region which is selected to be substantially greater than a selected doping of the base region which is selected to be substantially greater than a selected doping of the collector region such that the base region is fully depleted of free charge carriers without applied external voltage.

4. The diode according to claim 3 wherein said base width is selected from a range corresponding substantially to 60-75 nm when said doping of said emitter region corresponds substantially to $10^{19}$ cm$^{-3}$, said doping of said base corresponds substantially to $10^{17}$ cm$^{-3}$, and said doping of said collector corresponds substantially to $10^{15}$ cm$^{-3}$.

* * * * *